United States Patent [19]

Evans et al.

[11] Patent Number: 4,596,758

[45] Date of Patent: Jun. 24, 1986

[54] METHOD OF FORMING A PRESSURE SENSITIVE IMAGE TRANSFER SHEET WITH COLORED INK LAYER

[75] Inventors: Robert Evans; Robert Evans, Jr., both of Stamford, Conn.

[73] Assignee: Identicolor International, Inc., New York, N.Y.

[21] Appl. No.: 710,374

[22] Filed: Mar. 11, 1985

[51] Int. Cl.⁴ .................... G03C 1/90; G03C 1/74; G03C 1/68

[52] U.S. Cl. ..................... 430/258; 430/257; 430/259; 430/293

[58] Field of Search ............ 430/258, 257, 259, 293

[56] References Cited

U.S. PATENT DOCUMENTS

| | | | |
|---|---|---|---|
| 3,721,557 | 3/1973 | Inoue | 430/257 |
| 4,268,601 | 5/1981 | Namiki et al. | 430/258 |
| 4,282,310 | 8/1981 | Edhlund | 430/259 |

*Primary Examiner*—Richard L. Schilling

*Attorney, Agent, or Firm*—Silverman, Cass & Singer

[57] ABSTRACT

There is described a photomechanical method for forming pressure sensitive transfer reproductions of multicolor images upon a substrate involving the forming of a base coat protective layer on a substrate, applying one color ink on the base layer and a white ink overlayer on the color ink layer. The surface of the white ink overlayer is powdered and a layer of photoresist composition is applied. The photoresist covered layered substrate is exposed to a light source through an image carrying photographic negative film to harden the photoresist at the imaged areas forming a mask. Nonhardened photoresist composition areas along with their underlying layers are removed using stepwise solvent development steps. The steps are repeated for different colors with the final multicolor image being thoroughly dried and coated with a pressure sensitive adhesive to form the image transfer sheet. Drying between each step of formation is essential.

6 Claims, 3 Drawing Figures

METHOD OF FORMING A PRESSURE SENSITIVE IMAGE TRANSFER SHEET WITH COLORED INK LAYER

BACKGROUND OF THE INVENTION

This invention relates generally to photomechanical methods of forming pressure sensitive transfer sheets for reproduction of color images and more particularly, provides a method and means for effecting formation of residue-free color images on sheet substrates for artistic and color proofing purposes.

Many photomechanical processes are known for forming and/or transferring color images to selected substrates by burnishing. Among the common processes are those involving the use of radiation sensitive materials such as photoresists which can be activated by projecting an ultraviolet light on the sensitive surface of a photoresist overlay applied to an underlying ink or color carrying material in turn carried by a substrate. The exposed photoresist located at the imaged areas hardens to become a protective layer bonded to the underlying ink layer. The nonexposed areas are unchanged. The substrate can be bared by exposure to selected solvents in a process which may be referred to as "solvent development". A pressure sensitive adhesive is applied as a thin layer over the imaged and nonimaged areas as a final step in forming the transfer sheet.

The resulting sheet carrying the adhesive coating is placed image side down on a receptor surface and properly registered. The substrate is burnished at the image portions desired to be transferred while same are in contact with the receptor surface.

The substrate is not provided with a release coating, such as a silicone composition, so that when the adhesive is applied over the imaged and nonimaged areas, the adhesive holds to the substrate surface in at the nonimaged areas and will not be released when burnishing takes place during transfer of the imaged portions. Thus one can state that the adhesive has a stronger affinity for the receptor surface at the burnished areas than at the nonburnished areas. The hardened areas defining the image have a stronger affinity for the adhesive than for the substrate and hence adhere to the adhesive at the burnished areas, the underlying ink areas being firmly bonded to the hardened areas (of the imaged photoresist material) and hence transfer with the adhesive and underlying hardened photoresist areas. The bond formed between the nonimaged substrate areas, the respective intermediate layers and the adhesive coated areas is stronger than the bond formed between the receptor surface and said nonimaged adhesively coated areas so that the entire image (which has been burnished) is transferred to the receptor surface without adhesive residue.

One problem encountered in prior aforesaid color imaging methods involve the bleeding of the inks into the body of the underlying surface or into the substrate as stains. Other problems include the formation of undesirable adhesive halos about the transferred images, the transfer of only portions of the color image, the high cost of the specialty inks, the difficulty in mixing the inks with release materials and unsatisfactory bonding to the respective receptor surfaces. Nonuniformity and even pinholes are encountered. Difficulty in transferring fine line images also is experienced with prior methods and image transfer sheet. Registration has been a concern since the image carrier can shift position during burnishing. Additionally, the transferred images often are flat in appearance rather than possessing a desired gloss finish.

SUMMARY OF THE INVENTION

The invention provides a method and means for color imaging capable of use in transferring color and/or multicolor images by pressure contact transfer to a desired receptor base, the printed or the transferred image being clean, free of residue and free from staining or color bleeding. Transfer is effected by localized burnishing.

The invention provides a layer between an ink layer and an underlying substrate. Means are provided to prepare the outer surface of the ink layer to receive an overlayer comprising a photosensitive composition. Photoactivation of said photoresist material at the imaged areas hardens same. The nonhardened remainent photoresist material, as well as the ink below such areas and the underlying coating is removed by solvent development leaving the surface ready for application of the respective coated layers to permit formation of additional overlying multicolor images. The invention includes laying down of a layer of opaque material such as white ink, over each respective color ink layer to enable achievement of true opacity whereby providing a finished art result without costly overlays and the employment of trial and error method of selecting colors. Thus the printed final transferred art is capable of being photographed and/or used in the engraving process. The white ink layer also may be applied beneath the color ink layer and/or as an overlay. A coating of pressure sensitive adhesive is applied over the final image to complete the pressure sensitive transfer sheet.

DESCRIPTION OF PREFERRED EMBODIMENTS

Briefly, the invention shall be described in terms of photomechanically formed, solvent developed color or multicolor ink images reproduced on a substrate forming pressure sensitive transfer sheet for transfer of the image to a receptor medium by burnishing. An intermediate release layer or base coat is applied between the substrate and the ink layer. The pressure sensitive transfer medium includes a final pressure sensitive adhesive overcoat to enable contact transfer of the multicolor image by burnishing. A white ink layer is applied upon each color ink layer to provide opacity during the steps of forming the multicolor image.

Figure 1:
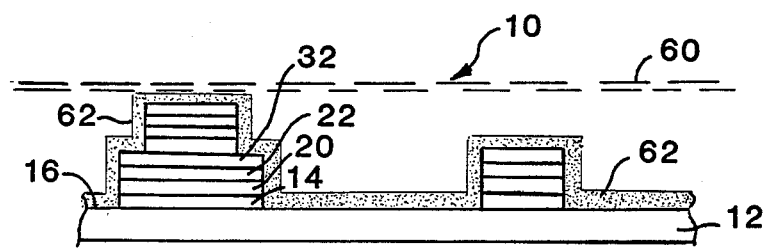
FIG. 1 is a sectional view of a substrate carrying a color image produced thereon according to the invention herein.

Referring to FIG. 1, there is represented a pressure sensitive transfer sheet 10 formed according to the invention and consisting of layers of individual color inks applied successively to a substrate, the individual images being taken from successively employed color separated photographic negatives, for example. The substrate employed normally does not carry a conventional release coating. Preferably, the substrate surface is smooth but this is not mandatory.

The substrate 12 may preferably comprise a non-silicone coated polystyrene, low gel, biaxially oriented sheet. The substrate 12 carries a layer 14 formed of a clear base coat (which may include release agents as a part thereof) on one surface thereof. The sheet employed herein is 5.2 mils in thickness. Using a #12 wire-wound draw rod 16, the base coat material is drawn along the surface of the substrate to provide the base coating 1 to 2 mils in thickness over the entire polystyrene sheet 12. A conventional exhaust fan is employed to disperse fumes during the coating process. In drawing down the layer 14 of base coat, considerable care is taken to employ an even motion with light to moderate pressure, taking care to avoid hesitation. The base coat 14 is dried thoroughly before undertaking the next step of applying the color ink.

The base coat 14 preferably is formed of a clear extender varnish that has a mixture of release agents and functions both as a protective layer and a release agent for the substrate. One example of a base coat formulation is as follows:

EXAMPLE I

610 Flex. Varnish blended with
44% resin
56% extender
10% silicone (liquid)
10% silicone wax (Dow Corning)

There should be no more than 20% silicone component, with equal amounts of silicone liquid and silicone wax.

Figure 2:
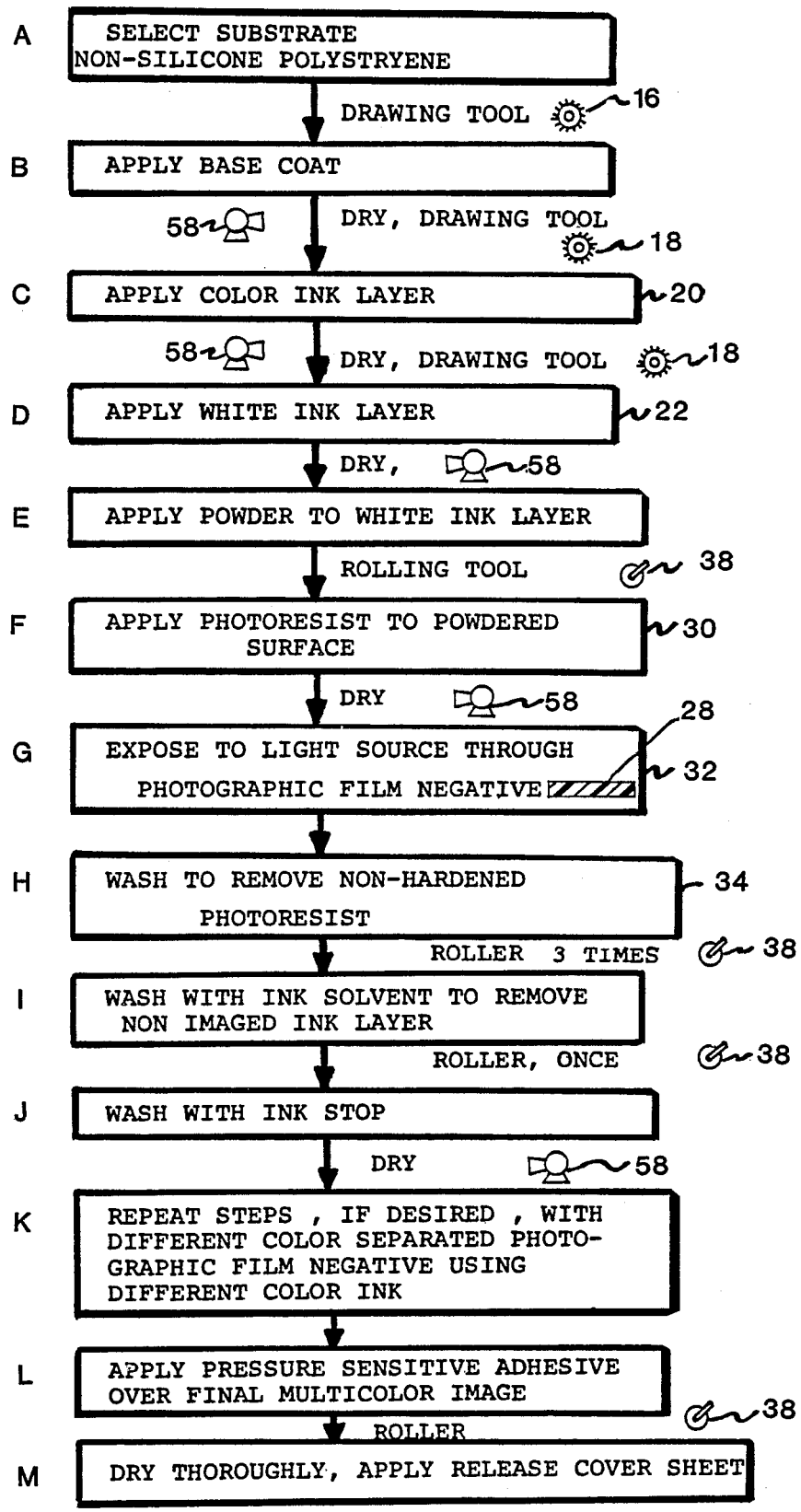
FIG. 2 is a flow chart illustrating the steps of forming the multicolor image transfer sheet of FIG. 1 according to the method of the invention.

The desired printing (color) ink 20 next is applied to the dry base coat surface 14' by drawing down the ink, again employing a #12 wire mesh rod (represented by reference character 18 in FIG. 2) similar to rod 16. Again a firm steady motion and moderate pressure is employed to assure a line free cover as well as color uniformity. If the spreading of the ink is too fast, there is a skipping effect over the entire substrate sheet. If the ink is spread too slowly, the ink may dry and a skin may form over areas of the coating. Ordinarily, the ink is drawn for 5 to 10 seconds to provide a layer approximately 1 to 2 mils in thickness. The resulting ink layer 20 is permitted to set for one or two seconds, and then is dried thoroughly, as by use of a conventional portable hair dryer, preferably using a sweeping motion to achieve uniformity. One example of a preferred gloss ink is a polyamite vehicle having a co-solvent of isopropyl alcohol (98% anhydrous) with finely milled pigments.

A white ink overlayer 22 preferably is applied to the dried ink layer 20, particularly if another color ink is to be applied. The white ink layer 22 has a thickness of from 1 to 2 mils. The white ink aids in preserving and protecting previously printed colors. Once applied, the white ink layer 22 is dried thoroughly prior to the performance of the next step of the process.

The exposed resulting dried surface of the white ink layer 22 or the color ink layer 20, as the case may be, thereafter is dusted with fine talc or resin powder 24 to ready the said surface to accept a photosensitizing composition 26. A small quantity of the talc or resin powder is poured upon the ink layer 20, and, using an applicator, is spread over said layer 20 or 22. Excess powder is removed. The powder avoids the repulsion of the photosensitizing material from said ink layer 20 or 22.

The sensitizing agent commonly referred to as a photoresist composition is drawn down the exposed powdered surface and forms a layer 30 thereover. Thorough drying is initiated and continued for about 45 seconds or until thoroughly dry. Once the photoresist layer 30 had been laid down, other activities should be carried out only in the presence of yellow light with the remaining room lighting terminated to prevent premature exposure of the photoresist. The photoresist material may be selected from among the following composition but the choice is not limited thereto. One example of a photoresist composition which has been employed to provide photosensitizing layer 30 is:

145 grams Casein
45 Milliliters Ammonium hydroxide
15 grams Ammonium Dichromate
4.5 Milliliters of Laboratory Aerosol
110 ounces of water (distilled)

The preferred thickness of the photoresist layer is from 0.5 to 1 mil.

The layered substrate now is prepared for exposure to light to form the first color image. The length of exposure of the photoresist-covered layered material is determined by the type of exposure equipment employed. Preferably, a NuArc flip top plate maker apparatus (not shown) is used for exposure purposes. The film negative 28 (FIG. 2) carrying an image or being a color separation of a composite image is placed on the layered sheet. Registration is achieved manually with minimum movement of the film negative 28 or layered sheet. Depending upon the type of equipment employed and the relative size of the image and ink color. Normally, the duration of exposure can be expected to be from about 10 to about 110 seconds. Exposure of between 10 and 60 seconds will result in a satisfactory image production. Black, being the most dense, will require the longest exposure time while white (or pale blue) will require the least exposure time.

Exposure of the photoresist-coated layered sheet causes the photographic sensitizing of the photoresist composition layer 30, hardening same at the exposed areas to define a mask 32 in the form of the image. Now the nonhardened areas (FIG. 2) must be removed, here preferably, by so-called solvent development, i.e. selected solvent action, to leave the hardened, exposed photoresist cover or mask 32 protecting the imaged color ink areas underlying the mask 32.

Accordingly, a photoresist solvent such as

EXAMPLE I

A solution of 0.75 ounces of Alkanol WXN in 5 gallons of distilled water, or

EXAMPLE II 4 grams Ammonium Carbonate
60 Milliliters Laboratory Aerosol
2 Milliliters Monoethanolamine
1 gallon of distilled water is applied to the surface of the exposed sheet using the same type of wire mesh rod 18 as employed earlier except that the rod 18 is rolled instead of being drawn. A rubber roller 38 then is rolled over the entire sheet surface to remove excess solvent. Rolling of the wire mesh rod 18 and the rubber roller 38 in lieu of drawing the same across the printed surface avoids slipping which is likely to result in scratching of the area and causing the underlying ink to be washed away where the protective mask 32 is scratched. Care must be exercised to avoid soaking of the solvent into the substrate 12.

Once the excess photoresist (non-hardened) has been removed, it is necessary to undertake the removal of the ink layer therebelow. Generally, one requires a first treatment with an "ink solvent" with a final wash employing a so-called "ink stop". The preferred "ink solvent" is a lactol-isopropyl alcohol mixture comprising 75% to 80% Lactol and 25% to 20% isopropyl alcohol, respectively.

The preferred ink stop employed herein is a lactol whose specific gravity is at 60° C., whose specific gravity is 0.738; whose distillation range is 92° to 106° Centigrade; whose flash point is 23° F., and whose aromatic content is 8.37.

Figure 3:
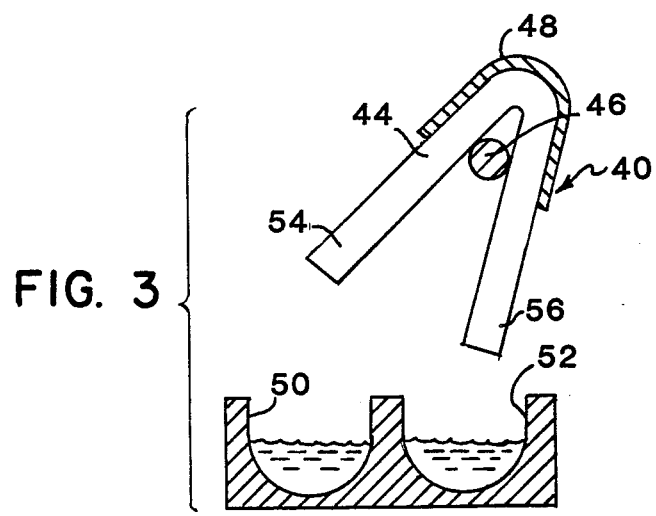
FIG. 3 is a sectional representation of a washing assembly employed to remove ink layers from the nonimaged areas from the exposed sheet during the practice of the method described herein.

In FIG. 3, a cleaning assembly 40 is illustrated which can be used in performing the washing step. This convenient cleaning assembly 40 comprises a wash bar 46, a strip 44 of sponge material which has been formed into an elongate V configuration and the bar being fastened to the center of the V.

The ends of the sponge are clamped by clamp 48. The ink solvent and ink stop solution are introduced into a pair of side by side elongate troughs 50,52 respectively. One elongate length 54 of the sponge 44 can be dipped into the ink solvent solution and the opposite elongate length 56 of sponge 44 dipped into the ink stop solvent. After removal of the nonhardened photoresist 34 and drying, the print is wiped first with the ink solvent and then wiped with ink stop solvent. Each wipe with ink solvent whereby to avoid solvent being absorbed by the substrate or any undercut portion of the protected image. The wet foam pad is wiped over the photoresist-free surface two or three times to remove the unprotected color ink layers. The number of wipes is dependent upon the number of ink layers to be removed. Next, the ink stop is applied to the resulting surface. Ink step is not always necessary, but advised. The first ink solvent wipe preferably is performed slowly with a few seconds delay to provide enough time for the ink layers to separate slightly from their underlying layers at the nonimaged areas.

The base coat layer also comes off in these solvent wipes, leaving the substrate clean for the next color or adhesive. The resulting transfer sheet carrying the transferable images then is blow-dried thoroughly to remove all solvent. The washing may be repeated in the same manner should the surface be excessively "dirty".

If successive colors are to be applied, one must apply another base coat layer 14 before proceeding to the application of the next color ink.

After completing the application of a multicolor image, the pressure sensitive transfer medium is formed by finally applying a suitable pressure sensitive adhesive as an overlay upon the surface carrying the completed final image so that the final composite color image can be transferred to a receptor medium by placement of the sheet thereon, locating the image and burnishing the substrate over the image areas. The preferred thickness of the adhesive layer is from 0.5 to 1.5 mil. The adhesive coated sheet surface temporarily adheres to the receptor surface, i.e., "grabs" same so that the image is not shifted or otherwise moved during the burnishing process. The adhesive composition has a greater affinity for the underlying surface at the nonburnished areas than for the receptor surface and hence there is a clean transfer of only the imaged areas. A clean break is made along the edges of the image. No adhesive residue or halo remains on the receptor medium.

The clear base coat 14 may be formed as a co-solvent polyamide which has been blended with ten percent liquid silicone and ten percent silicone wax. Of the benefits attributable to this base coat is protection of the underlying surface from staining, providing a consistent image release and aiding in providing a smooth printed-like finish to the inks forming the transferable image.

The base coat can be lactol based. Such base coat can be removed by the normal ink solvent/ink stop wipe, so as to leave the substrate bare of any stains or lacquer. When a different color image is to be superimposed, the removed base coat is replaced before the next color ink layer is laid down. The layer of white ink preferably is carried bonded to the underlying ink color layer to provide the desired opacity.

A hardened protective layer 32 is formed at those imaged areas masking the underlying ink layers. The resulting sheet is solvent developed by which the nonimaged areas are removed along with their underlying ink layers and base-coated areas. Once a final coating of pressure sensitive adhesive has been applied over the resulting multicolor images, thorough drying follows. Any commercially available pressure sensitive adhesive composition may be employed. A protective backing sheet 60 may be employed as a cover sheet therefor.

Generally, the drying technique employs a simple hand held conventional portable blower represented by reference character 56, e.g. such as a hair dryer manually held and manipulated in a sweeping motion above the coating to be dried. Normally, movement of the dryer in a unidirectional mode will be most advantageous, requiring 20 to 30 seconds for the normal thickness coating. The exposure duration ranges from about 30 to about 110 seconds, depending upon the output of the light source.

Use of sheet 10 requires simple placement of the transfer sheet with the image side facing the receptor at the required location and burnishing, say with a simple burnishing tool, the backside of the image carrying substrate receiving the pressure. The adhesive coated side of the transfer sheet seems to lock onto the receptor surface so that the receptor, the transferable image or the transfer sheet does not shift or move one relative to the other during the burnishing process. Normally, the transferred image is clean, that is, without a halo adhesive residue. If by inadvertent burnishing error, some adhesive is transferred onto the receptor sheet, it is easily removed by spot cleaning with a conventional rubber cement thinner and a cotton swab (not shown).

What we claim is:

1. A method of forming a pressure sensitive transfer sheet having at least one color ink image on a substrate for color proofing or the like comprising the steps of:
    (a) applying a protective release layer on the substrate;
    (b) thoroughly drying said protective release layer;
    (c) applying a thin color ink layer on the dried protective layer;
    (d) drying the color ink layer;
    (e) applying a white ink layer to the dried color ink layer;
    (f) drying the white ink layer;

(g) applying a fine powder coating to the dried ink layer;
(h) applying a layer of photoresist composition to the powdered ink layer;
(i) drying the photoresist layer;
(j) placing a film negative carrying a desired image for transfer upon the dried layered substrate in closely proximate relationship thereto;
(k) exposing the layered substrate to a radiation source through the film negative for a predetermined duration to form a hardened photoresist covering layer over the imaged areas only;
(l) removing all layers in the nonimaged areas by selective stepwise solvent development;
(m) drying the resultant surface, and
(n) applying a coating of pressure sensitive adhesive composition to the dried resultant surface and drying said coating to form the pressure sensitive transfer sheet.

2. The method of color imaging as claimed in claim 1 and the step of removing all layers in the nonimaged areas includes first applying a photoresist solvent to remove all photoresist from the nonimaged areas.

3. The method of color imaging as claimed in claim 2 and the step of removing all layers in the nonimaged areas further includes the steps of removing the ink layers in areas where the photoresist is removed by applying an ink solvent to the remainent exposed ink layers and thereafter applying an ink stop thereto and wiping the surface after each application until ink free.

4. The method of color imaging as claimed in claim 1 and forming a multicolor composite image by repeating the series of steps (a) to (m) using a different film negative in registry, each series of steps (a) to (m) requiring a different film negative and a different color ink to form a multilayer multicolor final composite image, the step (n) being performed only subsequent to the last color ink of the multilayer final composite image is applied and dried.

5. The method as claimed in any one of claims 1 to 4 in which the base layer is formed by drawing a release varnish base coat material across one substrate surface.

6. The method as claimed in any one of claims 1 to 4 in which the substrate is selected from the group comprising a polyester sheet, paper sheet, polystyrene.

* * * * *